United States Patent
Conley (10) Patent No.: US 8,119,334 B2
(45) Date of Patent: Feb. 21, 2012

(54) METHOD OF MAKING A SEMICONDUCTOR DEVICE USING NEGATIVE PHOTORESIST

(75) Inventor: Willard E. Conley, Schenectady, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 922 days.

(21) Appl. No.: 12/112,058

(22) Filed: Apr. 30, 2008

(65) Prior Publication Data
US 2009/0274982 A1    Nov. 5, 2009

(51) Int. Cl.
*G03F 7/26* (2006.01)
(52) U.S. Cl. ........................................... 430/314
(58) Field of Classification Search .................. 430/313, 430/314, 316, 323, 394
See application file for complete search history.

(56) References Cited

U.S. PATENT DOCUMENTS

| | | | |
|---|---|---|---|
| 6,222,936 B1 * | 4/2001 | Phan et al. | 382/149 |
| 6,300,036 B1 * | 10/2001 | Choi et al. | 430/270.1 |
| 6,306,558 B1 | 10/2001 | Lin | |
| 2004/0102048 A1 * | 5/2004 | Yamaguchi | 438/694 |
| 2005/0054194 A1 * | 3/2005 | Tsai et al. | 438/638 |

* cited by examiner

*Primary Examiner* — Kathleen Duda
*Assistant Examiner* — Caleen Sullivan
(74) *Attorney, Agent, or Firm* — James L. Clingan, Jr.

(57) ABSTRACT

Negative photoresist over an insulating layer is exposed to radiation according to a pattern for an opening in the insulating layer for filling conductive material. A post of the negative photoresist is left over the location where the opening in the insulating layer is to be formed. A developable hard mask is formed over the post by a spin-on process so that the hard mask over the post is much thinner than directly over the insulating layer. An etch back is performed to remove the hard mask from over the post so that the post of negative photoresist is thus exposed. The post is removed to form an opening in the hard mask. An etch is performed to form the opening in the insulating layer aligned to the opening in the hard mask. The opening in the insulating layer is filled with the conductive material.

19 Claims, 5 Drawing Sheets

METHOD OF MAKING A SEMICONDUCTOR DEVICE USING NEGATIVE PHOTORESIST

BACKGROUND

1. Field

This disclosure relates generally to semiconductor devices, and more specifically, to making semiconductor devices using photoresist.

2. Related Art

One of the continuing issues in semiconductor manufacturing is providing openings for filling with conductive material. These openings are beneficially precisely located with precisely defined dimensions that are repeatable. One of the difficulties is errors in the making of the mask. Any error, in the mask fabrication process, can be multiplied due to a variety of factors including the nature of optics, photoresist and other general process variations Accordingly, there is a need for improving the forming of openings by overcoming or improving upon one or more of the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a negative resist is formed over an insulating layer. The negative photoresist is exposed to radiation according to a pattern for an opening in the insulating layer for filling with a conductive material. The result is that a post of the negative photoresist is left over the location where the opening in the insulating layer is to be formed. A developable hard mask is formed over the post. The hard mask may be applied by a spin-on process so that the hard mask over the post is much thinner than the thickness of the hard mask directly over the insulating layer. An etch back, which may be performed by a timed application of developer, is performed to remove the hard mask from over the post so that the post of negative photoresist is thus exposed. The post is then removed to form an opening in the hard mask. An etch is then performed through the insulating layer to form the opening in the insulating layer which is aligned to the opening in the hard mask. After the hard mask is removed, the opening in the insulating layer is filled with the conductive material. The use of negative resist can provide for reduced adverse effects from variations in exposure energy and defocus. This is better understood by reference to the drawings the following written description.

Figure 1:
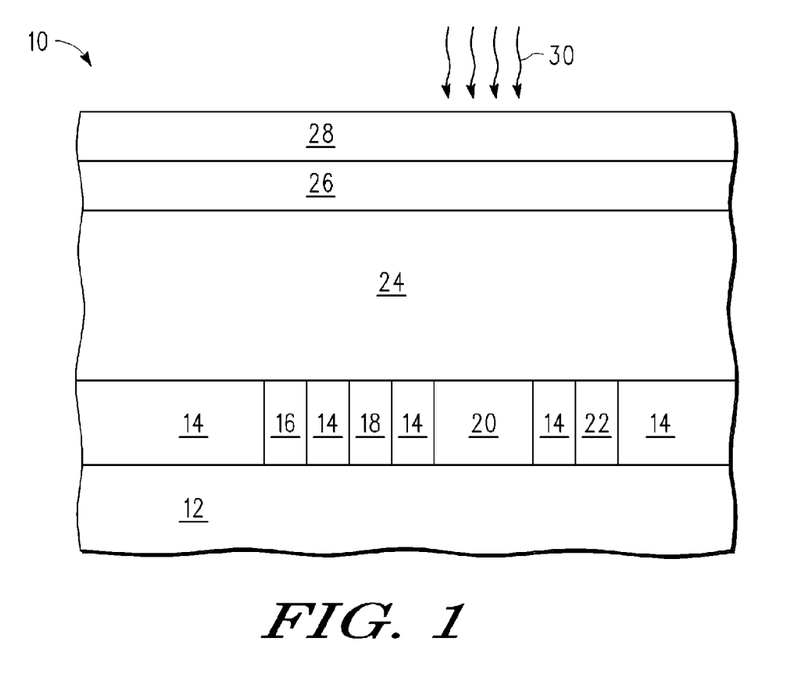
FIG. 1 is a cross section of a semiconductor device at a stage in process of a first embodiment.

Shown in FIG. 1 is a semiconductor device 10 comprising underlying circuitry 14, an insulating layer 14 over underlying circuitry 12, an insulating layer 24 over insulating layer 14, a bottom antireflective coating (BARC) 26, and a negative photoresist layer 28 over BARC 26. Conductive lines 16, 18, and 22 are in insulating layer 14. Also in insulating layer 14 and between conductive lines 22 and 18 is a contact landing 20. Underlying circuit 12 may include a semiconductor substrate with transistors formed in and over the semiconductor substrate. Underlying circuitry 12 may further include interconnect that provides connections to and among the at least some of the transistors. As an example, lines 16, 18, and 22 may be considered to be a minimum dimension for a metal line. Contact landing 20 is wider than the minimum dimension than that for a conductive line. Also as an example, the spacings between adjacent lines and contact landing 20 may also be considered a minimum dimension. Conductive lines may be primarily copper with conductive barriers surrounding the copper. Insulating layers 14 and 24 may be oxide and may be formed by more than one method such a PECVD and CVD. BARC 26 may be nitride as is typical of anti-reflective coatings. Exemplary dimensions are that metal lines 16, 18, and 22 and contact landing 20 may be about 500 Angstroms thick, insulating layer 24 may be about 1500 Angstroms thick, BARC 26 may be about 400 Angstroms, and negative photoresist layer 28 may be about 500 Angstroms thick. An exemplary negative photoresist that may be used for negative photoresist 28 is model TArF-N3001 available through Tokyo Ohka Kogyo (TOK) America. Also shown in FIG. 1 is patterned radiation 30 which exposes negative photoresist layer 28 according to a desired pattern. This application of patterned radiation 30 can be performed in a scanner-clean track photocluster that includes the ability to perform photo, spin-on, and developer steps.

Figure 2:
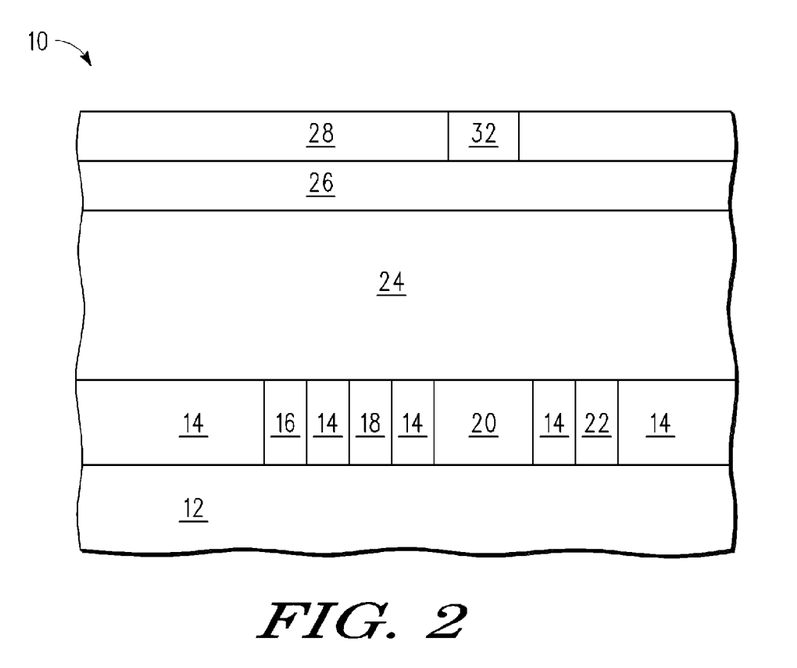
FIG. 2 is a cross section of the semiconductor device of FIG. 1 at a subsequent stage of the process.

Shown in FIG. 2 is semiconductor device 10 after the application of patterned radiation 30 which forms an exposed portion 32 of negative photoresist 28 in the location where patterned radiation 30 was applied.

Figure 3:
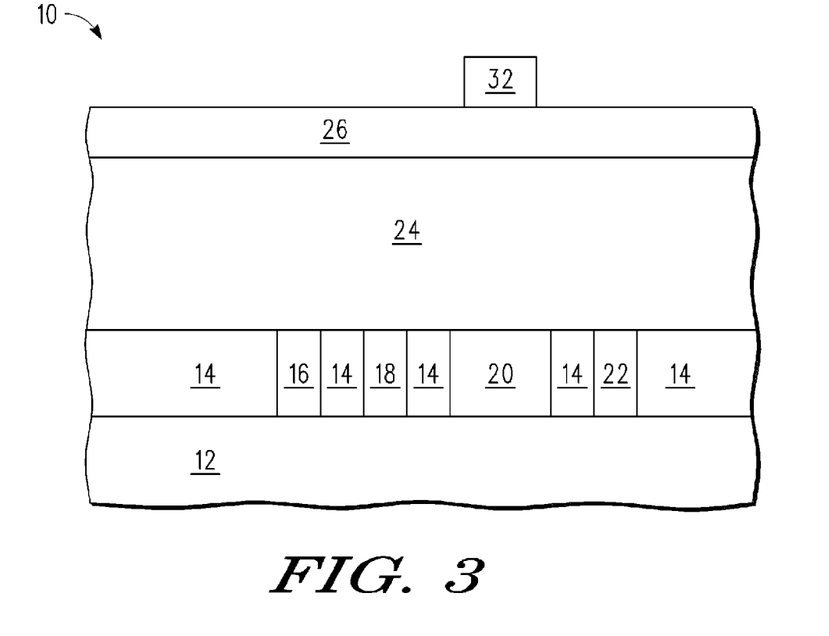
FIG. 3 is a cross section of the semiconductor device of FIG. 2 at a subsequent stage of the process.

Shown in FIG. 3 is semiconductor device 10 after removing negative photoresist layer 28 that was not exposed to patterned radiation 30 so that portion 32 remains. Portion is preferably aligned to contact landing 20 as well as is possible within the tolerances of the technology being used. Portion 32 preferably has a width that is a little less that the width of contact landing 20. Portion 32 may also be called a photoresist post. This step may be performed in the scanner-clean track photocluster.

Figure 4:
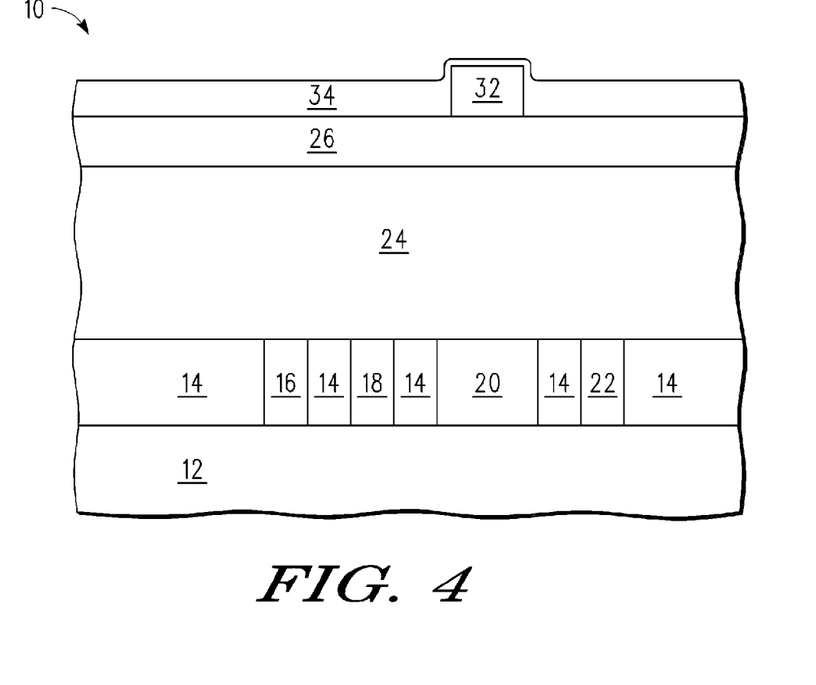
FIG. 4 is a cross section of the semiconductor device of FIG. 3 at a subsequent stage of the process.

Shown in FIG. 4 is semiconductor device 10 after deposition of a developable hard mask 34 over BARC 26 and portion 32. The deposition may be performed by a spin-on process so that the thickness of developable hard mask 34 over portion 32 is much thinner than where developable hard mask 25 is directly over BARC 26. This step may be performed in the scanner-clean track photocluster.

Figure 5:
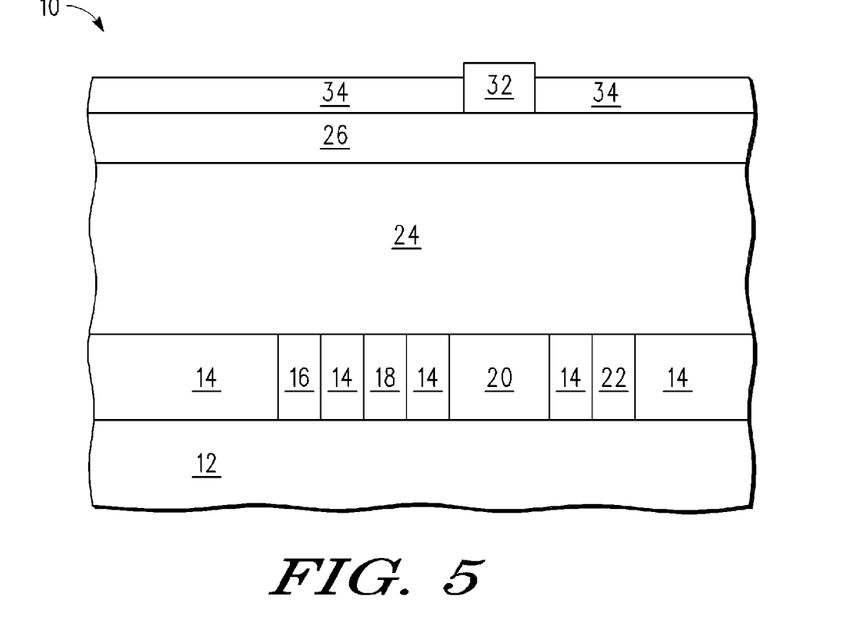
FIG. 5 is a cross section of the semiconductor device of FIG. 4 at a subsequent stage of the process.

Shown in FIG. 5 is semiconductor device 5 after performing a process that uniformly reduces developable hard mask 34. This may be achieved with a timed application of developer. An example of a developer that is selective between developable hard mask 34 and portion 32 of exposed negative photoresist is an industry standard developer that is comprised of tetra methyl ammonium hydroxide (TMAH) and water. Because portion 32 has already been exposed to radiation, the TMAH and water does not appreciably remove portion 32. The top surface of portion 32 thus no longer has developable hard mask 34 on it so that the top surface of portion 32 is exposed. This step may be performed in the scanner-clean track photocluster.

Figure 6:
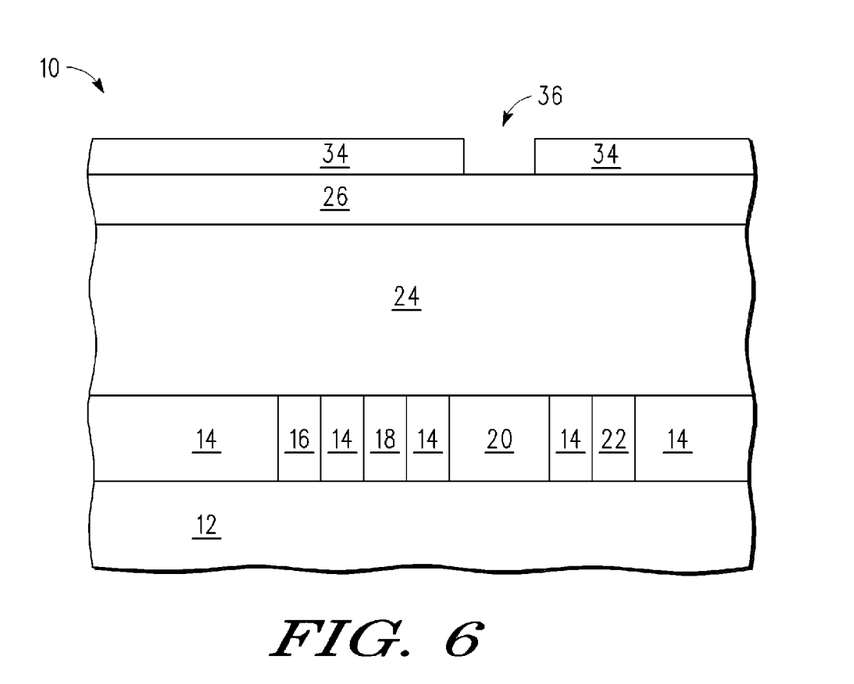
FIG. 6 is a cross section of the semiconductor device of FIG. 5 at a subsequent stage of the process.

Shown in FIG. 6 is semiconductor device 10 after removing portion 32 using an etchant that is used in removing negative photoresist that has been exposed to radiation but not developable hard mask 34. An example of such an etchant is a plasma etch that uses oxygen ($O_2$). The removal of portion 32 results in leaving an opening 36 in developable hard mask where BARC 26 is exposed.

Figure 7:
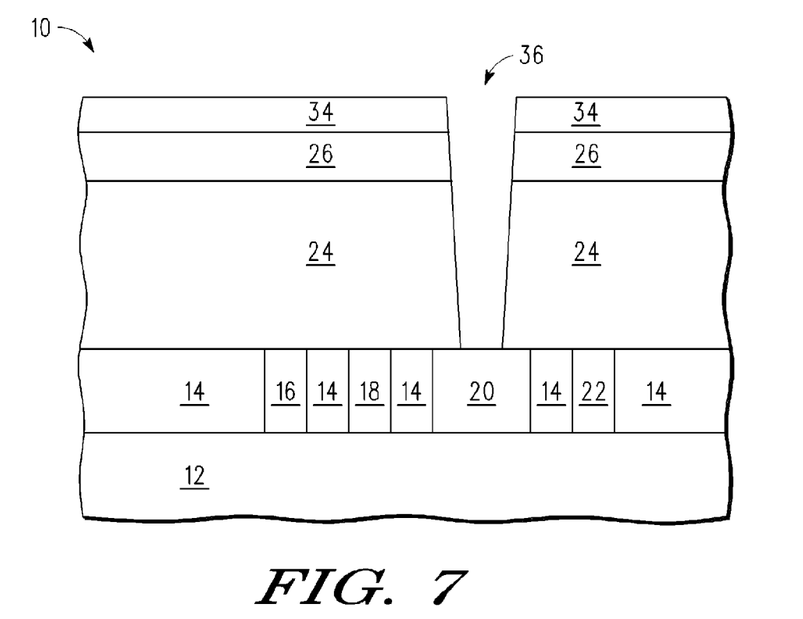
FIG. 7 is a cross section of the semiconductor device of FIG. 6 at a subsequent stage of the process.

Shown in FIG. 7 is semiconductor device 10 after continuing the plasma etch so that BARC 26 and insulating layer 24 have a contact opening through to contact landing 20 aligned to opening 36.

Figure 8:
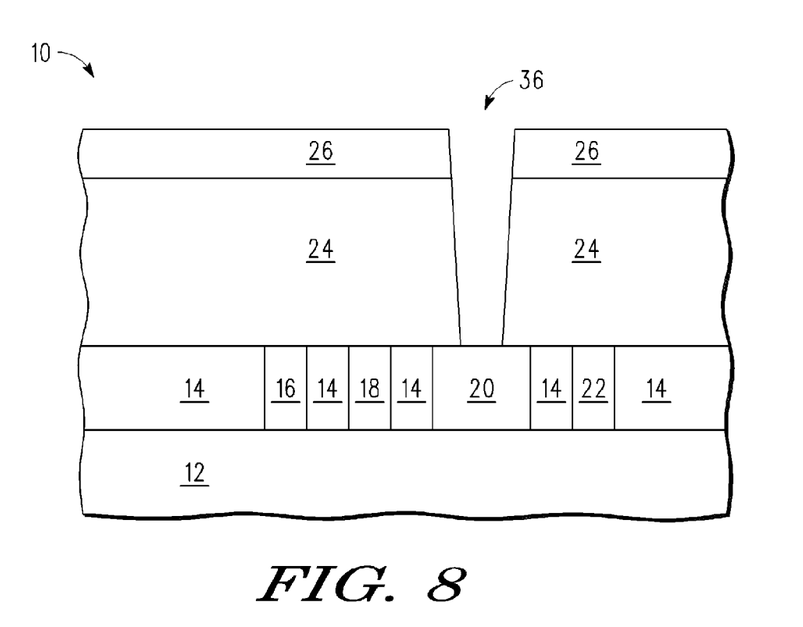
FIG. 8 is a cross section of the semiconductor device of FIG. 7 at a subsequent stage of the process.

Shown in FIG. 8 is semiconductor device 10 after removing developable hard mask 34. This may be achieved using TMAH and water.

Figure 9:
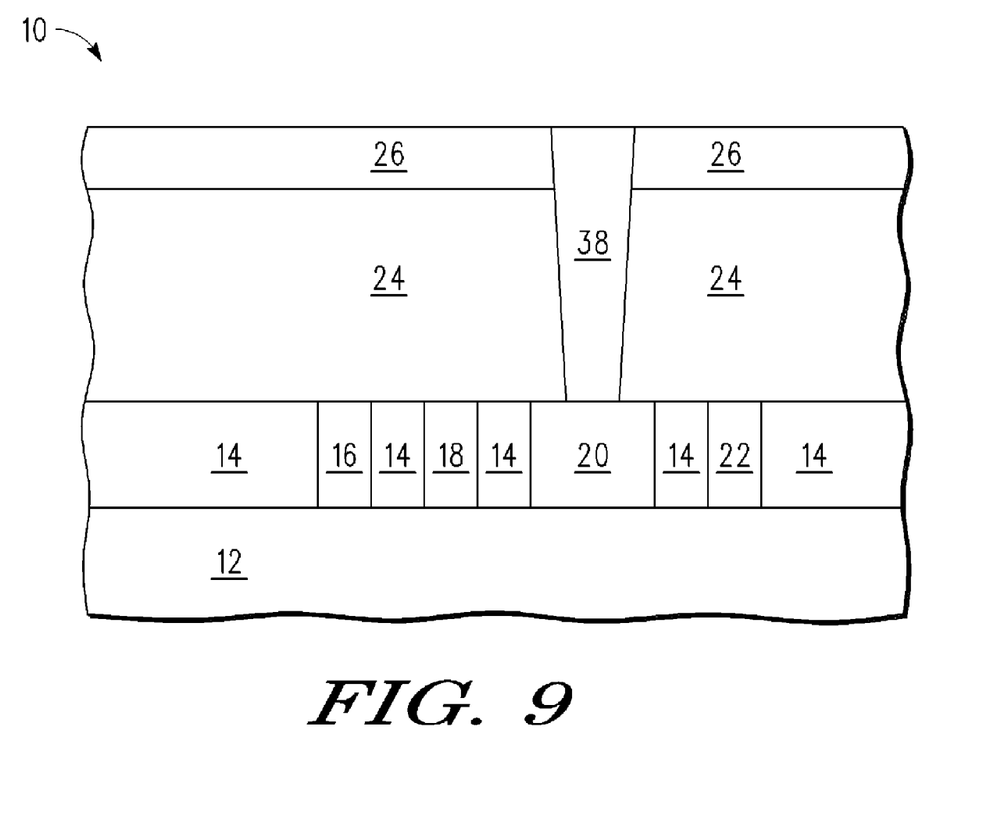
FIG. 9 is a cross section of the semiconductor device of FIG. 8 at a subsequent stage of the process.

Shown in FIG. 9 is semiconductor device 10 after filling the contact opening with conductive material. Typical contact fill includes a conductive barrier for a liner and another metal, such as copper, as the major portion of the contact fill.

The result is a contact opening that is made aligned to exposed negative photoresist, portion 32. Negative photoresist has been found to have better characteristics than positive photoresist. In this case of forming openings, however, the total area of the openings is a relatively small portion of the total area of the particular chip or wafer being exposed. If negative photoresist were simply used by being exposed where the openings were not to be formed and thus not exposed over the locations where the openings were to be formed, the radiation energy would be spread out much more. Typical relative percentages are about 8 percent for the openings and 92 percent for the background. Further, a defect in the mask where an exposure is occurring could result in the formation of a spurious opening and thus a likely failure of the device. The use of negative photoresist results in less variation in performance in the photoresist for variation in exposure energy and defocus. That is to say, in positive photoresist the energy variation from one exposure to the next is commonly sufficient to result in a variation in the size of the openings from one exposure to the next. In the case of negative photoresist, the size of the photoresist posts varies less for the same change in energy. Thus, the use of photoresist posts for defining the openings used for contacts results in less variation in size for a given in energy and defocus.

By now it should be appreciated that there has been provided a method of forming openings in the fabrication of a device. The method includes forming an anti-reflective coating layer overlying a target layer in which desired openings are to be formed. The method also includes forming a negative photoresist layer overlying the anti-reflective coating layer. The method also includes exposing the negative photoresist layer with focused exposure energy according to a given positive pattern mask of the openings to be formed, wherein exposing according to the positive pattern mask creates exposed portions and unexposed portions of the negative photoresist layer. The method also includes developing the exposed negative photoresist layer, wherein developing removes unexposed portions of the negative photoresist layer to uncover corresponding portions of the anti-reflective coating layer, and wherein the exposed portions of the negative photoresist layer remain to create a negative pattern mask of the positive pattern mask. The method also includes forming a spin-on developable hard mask layer overlying the negative pattern mask and the uncovered portions of the anti-reflective coating layer. The method also includes. removing the spin-on developable hard mask layer overlying the negative pattern mask by at least an amount sufficient to uncover the patterned negative photoresist layer The method also includes removing the negative pattern mask, wherein removing the negative pattern mask forms a subsequent positive pattern mask out of a remainder portion of the spin-on developable hard mask layer. The method also includes etching the anti-reflection coating layer and the target layer according to the subsequent positive pattern mask, wherein etching forms the desired openings within the target layer. The method may be further characterized by the steps of forming the anti-reflective coating layer, forming the negative photoresist layer, exposing the negative photoresist layer, developing the exposed negative photoresist layer, forming the spin-on developable hard mask layer, removing the spin-on developable hard mask layer overlying the negative patter mask all being performed within a same photo cluster. The method may be further characterized by the anti-reflective coating layer comprising a silicon anti-reflective coating. The method may be further characterized by the exposure energy comprises energy in the range of 1-200 mJ/cm$^2$. The method may be further characterized by the exposure energy comprises energy in the range of 20-30 mJ/cm$^2$. The method may be further characterized by developing the exposed negative photoresist layer comprising using an aqueous developer solution. The method may be further characterized by removing the spin-on developable hard mask layer including developing the spin-on developable hard mask layer in an aqueous solution until the spin-on developable hard mask layer is of a thickness less than a thickness of the patterned negative photoresist layer overlying the anti-reflective coating layer. The method may be further characterized by the aqueous solution comprises a high pH developer solution. The method may be further characterized by the high pH developer solution comprises tetra methyl ammonium hydroxide (TMAH) and water. The method may be further characterized by removing the negative pattern mask including using an etch having selectivity to the subsequent positive pattern mask. The method may be further characterized by the etch comprises a plasma etch. The method may be further characterized by etching the anti-reflective coating layer and the target layer includes using an etch having selectivity to the subsequent positive pattern mask. The method may be further characterized by removing the subsequent positive pattern mask overlying the target layer and forming a conductive material within the desired openings of the target layer. The method may be further characterized by the target layer comprising an interlevel dielectric layer of a semiconductor substrate structure, wherein the semiconductor substrate structure comprises a semiconductor substrate including circuitry, an insulating layer overlying the semiconductor substrate, and at least one contact area within the insulating layer. The method may be further characterized by the interlevel dielectric having a thickness on the order of 150 nm, the anti-reflective coating having a thickness on the order of 35 nm, the negative photoresist layer having a thickness in a range on the order of 40-70 nm, and the spin-on developable hard mask layer having a thickness in the range on the order of 30-60 nm. The method may be further characterized by the desired openings comprising contact openings having a dimension on the order of less than 100 nm. The method may be further characterized by. The method may be further characterized by the dimension of the desired openings comprises a diameter on the order of 45-50 nm.

Also described is a method of forming openings in the fabrication of a device. The method includes forming an anti-reflective coating layer overlying a target layer in which desired openings are to be formed, wherein the target layer comprises an interlevel dielectric layer of a semiconductor substrate structure, wherein the semiconductor substrate structure comprises a semiconductor substrate including circuitry, an insulating layer overlying the semiconductor substrate, and at least one contact area within the insulating layer, wherein the interlevel dielectric having a thickness on the order of 150 nm, the anti-reflective coating having a thickness on the order of 35 nm, the negative photoresist layer having a thickness in a range on the order of 40-70 nm, and the spin-on developable hard mask layer having a thickness in the range on the order of 30-60 nm. The method also includes forming a negative photoresist layer overlying the anti-reflective coating layer. The method also includes exposing the negative photoresist layer with focused exposure energy according to a given positive pattern mask of the openings to be formed, wherein exposing according to the positive pattern mask creates exposed portions and unexposed portions of the negative photoresist layer. The method also includes developing the exposed negative photoresist layer, wherein developing removes unexposed portions of the negative photoresist layer to uncover corresponding portions of the anti-reflective coating layer, and wherein the exposed portions of the negative photoresist layer remain to create a negative pattern mask of the positive pattern mask. The method also includes forming a spin-on developable hard mask layer overlying the negative pattern mask and the uncovered portions of the anti-reflective coating layer. The method also includes removing the spin-on developable hard mask layer overlying the negative pattern mask by at least an amount sufficient to uncover the patterned negative photoresist layer. The method also includes removing the negative pattern mask, wherein removing the negative pattern mask forms a subsequent positive pattern mask out of a remainder portion of the spin-on developable hard mask layer. The method also includes etching the anti-reflection coating layer and the target layer according to the subsequent positive pattern mask, wherein etching forms the desired openings within the target layer, wherein the steps of forming the anti-reflective coating layer, forming the negative photoresist layer, exposing the negative photoresist layer, developing the exposed negative photoresist layer, forming the spin-on developable hard mask layer, removing the spin-on developable hard mask layer overlying the negative patter mask are all performed within a same photo cluster.

Explained also is a of forming openings in the fabrication of a device. The method includes forming an anti-reflective coating layer overlying a target layer in which desired openings are to be formed, wherein the target layer comprises an interlevel dielectric layer of a semiconductor substrate structure, wherein the semiconductor substrate structure comprises a semiconductor substrate including circuitry, an insulating layer overlying the semiconductor substrate, and at least one contact area within the insulating layer, and wherein the desired openings comprise contact openings having a dimension on the order of less than 100 nm. The method also includes forming a negative photoresist layer overlying the anti-reflective coating layer. The method also includes exposing the negative photoresist layer with focused exposure energy according to a given positive pattern mask of the openings to be formed, wherein exposing according to the positive pattern mask creates exposed portions and unexposed portions of the negative photoresist layer. The method also includes developing the exposed negative photoresist layer, wherein developing removes unexposed portions of the negative photoresist layer to uncover corresponding portions of the anti-reflective coating layer, and wherein the exposed portions of the negative photoresist layer remain to create a negative pattern mask of the positive pattern mask. The method also includes forming a spin-on developable hard mask layer overlying the negative pattern mask and the uncovered portions of the anti-reflective coating layer. The method also includes removing the spin-on developable hard mask layer overlying the negative pattern mask by at least an amount sufficient to uncover the patterned negative photoresist layer. The method also includes removing the negative pattern mask, wherein removing the negative pattern mask forms a subsequent positive pattern mask out of a remainder portion of the spin-on developable hard mask layer. The method also includes etching the anti-reflection coating layer and the target layer according to the subsequent positive pattern mask, wherein etching forms the desired openings within the target layer, wherein the steps of forming the anti-reflective coating layer, forming the negative photoresist layer, exposing the negative photoresist layer, developing the exposed negative photoresist layer, forming the spin-on developable hard mask layer, removing the spin-on developable hard mask layer overlying the negative patter mask are all performed within a same photo cluster.

Although the invention is described herein with reference to specific embodiments, various modifications and changes can be made without departing from the scope of the present invention as set forth in the claims below. For example, the process described for applying the developable hard mask was described as being spin-on, but another comparable material applied in a different way be found acceptable. The etch back could be by chemical mechanical polishing (CMP) so that the deposition could even be relatively conformal and the CMP could be stopped after reaching the negative photoresist post. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming openings in the fabrication of a device comprising:

forming an anti-reflective coating layer overlying a target layer in which desired openings are to be formed;

forming a negative photoresist layer overlying the anti-reflective coating layer;

exposing the negative photoresist layer with focused exposure energy according to a given positive pattern mask of the openings to be formed, wherein exposing according to the positive pattern mask creates exposed portions and unexposed portions of the negative photoresist layer;

developing the exposed negative photoresist layer, wherein developing removes unexposed portions of the negative photoresist layer to uncover corresponding portions of the anti-reflective coating layer, and wherein the exposed portions of the negative photoresist layer remain to create a negative pattern mask of the positive pattern mask;

forming a spin-on developable hard mask layer overlying the negative pattern mask and the uncovered portions of the anti-reflective coating layer;

removing the spin-on developable hard mask layer overlying the negative pattern mask by at least an amount sufficient to uncover the patterned negative photoresist layer;

removing the negative pattern mask, wherein removing the negative pattern mask forms a subsequent positive pattern mask out of a remainder portion of the spin-on developable hard mask layer; and etching the anti-reflection coating layer and the target layer according to the subsequent positive pattern mask, wherein removing the spin-on developable hard mask layer includes developing the spin-on developable hard mask layer in an aqueous solution until the spin-on developable hard mask layer is of a thickness less than a thickness of the patterned negative photoresist layer overlying the anti-reflective coating layer.

2. The method of claim 1, wherein the steps of forming the anti-reflective coating layer, forming the negative photoresist layer, exposing the negative photoresist layer, developing the exposed negative photoresist layer, forming the spin-on developable hard mask layer, removing the spin-on developable hard mask layer overlying the negative patter mask are all performed within a same photo cluster.

3. The method of claim 1, wherein the anti-reflective coating layer comprises a silicon anti-reflective coating.

4. The method of claim 1, wherein the exposure energy comprises energy in the range of 1-200 mJ/cm$^2$.

5. The method of claim 4, further wherein the exposure energy comprises energy in the range of 20-30 mJ/cm$^2$.

6. The method of claim 1, wherein developing the exposed negative photoresist layer comprises using an aqueous developer solution.

7. The method of claim 1, wherein etching forms the desired openings having a dimension on the order of less than 100 nm within the target layer.

8. The method of claim 1, further wherein the aqueous solution comprises a high pH developer solution.

9. The method of claim 8, further wherein the high pH developer solution comprises tetra methyl ammonium hydroxide (TMAH) and water.

10. The method of claim 1, wherein removing the negative pattern mask includes using an etch having selectivity to the subsequent positive pattern mask.

11. The method of claim 10, further wherein the etch comprises a plasma etch.

12. The method of claim 1, wherein etching the anti-reflective coating layer and the target layer includes using an etch having selectivity to the subsequent positive pattern mask.

13. The method of claim 12, further wherein the etch comprises a plasma etch.

14. The method of claim 1, further comprising:
removing the subsequent positive pattern mask overlying the target layer; and
forming a conductive material within the desired openings of the target layer.

15. The method of claim 1, wherein the target layer comprises an interlevel dielectric layer of a semiconductor substrate structure, wherein the semiconductor substrate structure comprises a semiconductor substrate including circuitry, an insulating layer overlying the semiconductor substrate, and at least one contact area within the insulating layer.

16. The method of claim 15, wherein the interlevel dielectric having a thickness on the order of 150 nm, the anti-reflective coating having a thickness on the order of 35 nm, the negative photoresist layer having a thickness in a range on the order of 40-70 nm, and the spin-on developable hard mask layer having a thickness in the range on the order of 30-60 nm.

17. The method of claim 1, further wherein the dimension of the desired openings comprises a diameter on the order of 45-50 nm.

18. A method of forming openings in the fabrication of a device comprising:
forming an anti-reflective coating layer overlying a target layer in which desired openings are to be formed, wherein the target layer comprises an interlevel dielectric layer of a semiconductor substrate structure, wherein the semiconductor substrate structure comprises a semiconductor substrate including circuitry, an insulating layer overlying the semiconductor substrate, and at least one contact area within the insulating layer, wherein the interlevel dielectric having a thickness on the order of 150 nm, the anti-reflective coating having a thickness on the order of 35 nm, the negative photoresist layer having a thickness in a range on the order of 40-70 nm, and a spin-on developable hard mask layer having a thickness in the range on the order of 30-60 nm;

forming a negative photoresist layer overlying the anti-reflective coating layer;

exposing the negative photoresist layer with focused exposure energy according to a given positive pattern mask of the openings to be formed, wherein exposing according to the positive pattern mask creates exposed portions and unexposed portions of the negative photoresist layer;

developing the exposed negative photoresist layer, wherein developing removes unexposed portions of the negative photoresist layer to uncover corresponding portions of the anti-reflective coating layer, and wherein the exposed portions of the negative photoresist layer remain to create a negative pattern mask of the positive pattern mask;

forming the spin-on developable hard mask layer overlying the negative pattern mask and the uncovered portions of the anti-reflective coating layer;

removing the spin-on developable hard mask layer overlying the negative pattern mask by at least an amount sufficient to uncover the patterned negative photoresist layer;

removing the negative pattern mask, wherein removing the negative pattern mask forms a subsequent positive pattern mask out of a remainder portion of the spin-on developable hard mask layer; and etching the anti-reflection coating layer and the target layer according to the subsequent positive pattern mask, wherein etching forms the desired openings within the target layer, wherein the steps of forming the anti-reflective coating layer, forming the negative photoresist layer, exposing the negative photoresist layer, developing the exposed negative photoresist layer, forming the spin-on developable hard mask layer, removing the spin-on developable hard mask layer overlying the negative pattern mask are all performed within a same photo cluster.

19. A method of forming openings in the fabrication of a device comprising:

forming an anti-reflective coating layer overlying a target layer in which desired openings are to be formed, wherein the target layer comprises an interlevel dielectric layer of a semiconductor substrate structure, wherein the semiconductor substrate structure comprises a semiconductor substrate including circuitry, an insulating layer overlying the semiconductor substrate, and at least one contact area within the insulating layer, and wherein the desired openings comprise contact openings having a dimension on the order of less than 100 nm;

forming a negative photoresist layer overlying the anti-reflective coating layer, the negative photoresist layer having a thickness in a range on the order of 40-70 nm;

exposing the negative photoresist layer with focused exposure energy according to a given positive pattern mask of the openings to be formed, wherein exposing according to the positive pattern mask creates exposed portions and unexposed portions of the negative photoresist layer;

developing the exposed negative photoresist layer, wherein developing removes unexposed portions of the negative photoresist layer to uncover corresponding portions of the anti-reflective coating layer, and wherein the exposed portions of the negative photoresist layer remain to create a negative pattern mask of the positive pattern mask;

forming a spin-on developable hard mask layer overlying the negative pattern mask and the uncovered portions of the anti-reflective coating layer;

removing the spin-on developable hard mask layer overlying the negative pattern mask by at least an amount sufficient to uncover the patterned negative photoresist layer;

removing the negative pattern mask, wherein removing the negative pattern mask forms a subsequent positive pattern mask out of a remainder portion of the spin-on developable hard mask layer; and etching the anti-reflection coating layer and the target layer according to the subsequent positive pattern mask, wherein etching forms the desired openings within the target layer, wherein the steps of forming the anti-reflective coating layer, forming the negative photoresist layer, exposing the negative photoresist layer, developing the exposed negative photoresist layer, forming the spin-on developable hard mask layer, removing the spin-on developable hard mask layer overlying the negative patter mask are all performed within a same photo cluster.

* * * * *